US006765447B2

United States Patent
Suzuki

(10) Patent No.: US 6,765,447 B2
(45) Date of Patent: Jul. 20, 2004

(54) MICROWAVE OSCILLATOR HAVING IMPROVED PHASE NOISE OF OSCILLATION SIGNAL

(75) Inventor: Shigetaka Suzuki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/075,192

(22) Filed: Feb. 14, 2002

(65) Prior Publication Data

US 2002/0113661 A1 Aug. 22, 2002

(30) Foreign Application Priority Data

Feb. 22, 2001 (JP) ........................................ 2001-046745

(51) Int. Cl.[7] .............................................. H03B 11/10
(52) U.S. Cl. ............................ 331/107 SL; 331/117 D
(58) Field of Search ........................ 331/107 SL, 117 D, 331/107 DP, 177 V, 117 FE, 96, 99

(56) References Cited

U.S. PATENT DOCUMENTS

| | | | |
|---|---|---|---|
| 4,855,691 A | * 8/1989 | Argintaru et al. | ............ 331/172 |
| 4,871,983 A | * 10/1989 | Graycar | ........................ 331/96 |
| 4,951,041 A | * 8/1990 | Inada et al. | .................. 345/691 |
| 5,294,848 A | * 3/1994 | Kannegundla | ............... 327/269 |
| 5,789,894 A | * 8/1998 | Neiger et al. | ................ 318/781 |
| 6,252,470 B1 | * 6/2001 | Togawa | ................... 331/117 D |
| 6,388,534 B1 | * 5/2002 | Balzano et al. | ............. 331/175 |
| 6,535,072 B2 | * 3/2003 | Yamashita et al. | ....... 331/107 G |

FOREIGN PATENT DOCUMENTS

| | | |
|---|---|---|
| JP | 08-204447 | 8/1996 |
| JP | 09260945 | 10/1997 |

OTHER PUBLICATIONS

The Design of Dielectric Resonator VCO, Geng Hui eta l., Internal Conference on Circuits and Sstems, vol. 1, (Jun. 16–17, 1991), pp. 399–402.
60 GHZ Dielectrically Stabilized Monolithic Voltage Controlled Oscillator, Inoue T., et al., Proceedings of the 25th European Microwave Conference 1995. Bologna, Sep. 4–7, 1995, Proceedings of The European Microwave Conference, Swanley, Nexus Media, GB, vol. 1. Conf. 25, pp. 281–284.

* cited by examiner

Primary Examiner—Timothy P. Callahan
Assistant Examiner—Cassandra Cox
(74) Attorney, Agent, or Firm—Brinks Hofer Gilson & Lione

(57) ABSTRACT

A microwave oscillator includes a transistor for oscillation, an insulating substrate on which the transistor is mounted, a first strip conductor which is attached to the insulating substrate and which has one end connected to the output terminal of the transistor, and a second strip conductor which is attached to the insulating substrate and which has one end connected to input terminal of the transistor. The microwave oscillator further includes a TE01-mode dielectric resonator which couples with the first strip conductor and the second strip conductor, and a varactor diode. The varactor diode has one end connected to the other end of the first strip conductor or the other end of the second strip conductor, and the other end is RF-grounded, such that the capacitance of the varactor diode can be changed.

45 Claims, 1 Drawing Sheet

MICROWAVE OSCILLATOR HAVING IMPROVED PHASE NOISE OF OSCILLATION SIGNAL

BACKGROUND OF THE INVENTION

1. Field of the Invention

The present invention relates a microwave oscillator which performs oscillation at several GHz and which has an oscillation frequency that can be changed.

2. Description of the Related Art

FIG. 2 illustrates a microwave oscillator circuit of the related art. A transistor 21, which is an active device, for oscillation has a collector connected to one end of a first strip conductor 22 and has a base connected to one end of a second strip conductor 23. The first strip conductor 22 and the second strip conductor 23 are provided on an insulating substrate (not shown) so as to oppose each other. A cylindrical dielectric resonator 24 is provided between the first strip conductor 22 and the second strip conductor 23. Consequently, the first strip conductor 22, the dielectric resonator 24, and the second strip conductor 23 form a feedback loop with the base as an input terminal and the collector as an output terminal.

In addition, a third strip conductor 25 is provided on the insulating substrate to couple with the dielectric resonator 24. The third strip conductor 25 has one end connected to ground through a varactor diode 26, and a control voltage is applied to the other end.

When the control voltage is changed to alter the capacitance of the varactor diode 26, the magnetic field distribution in the third strip conductor 25 changes relative to the dielectric resonator 24. This causes a change in coupling between the dielectric resonator 24 and the third strip conductor 25. Thus, the changes in the capacitance of the varactor diode 26 and in the coupling cause a change in the total resonant capacitance including the dielectric resonance 24, thereby changing the oscillation frequency.

However, in the above microwave oscillator of the related art, the dielectric resonator is coupled with the first through third strip conductors, thus reducing the apparent Q factor of the dielectric resonator. Thus, the microwave oscillator has a problem in that the phase noise of an oscillation signal is reduced to about 60 dB/kHz.

In addition, the dielectric resonator is coupled with the first and second strip conductors to form the feedback loop and is also coupled with the third strip conductor for changing the oscillation frequency. It is therefore difficult to set the positions thereof so that the couplings with the respective strip conductors are balanced.

SUMMARY OF THE INVENTION

Accordingly, it is an object of the present invention to provide a microwave oscillator having an improved phase noise of an oscillation signal and allowing easy setting of the coupling between a dielectric resonator and strip conductors for feedback.

To this end, according to an aspect of the present invention, there is provided a microwave oscillator. The microwave oscillator includes a transistor for oscillation, an insulating substrate on which the transistor is mounted, a first strip conductor which is provided on the insulating substrate and which has a first end connected to an output terminal of the transistor, and a second strip conductor which is provided on the insulating substrate and which has a first end connected to an input terminal of the transistor. The microwave oscillator further includes a varactor diode and a TE01-mode dielectric resonator which is provided on the insulating substrate and which couples with the first strip conductor and the second strip conductor. A first end of the varactor diode is connected to a second end of the first strip conductor or a second end of the second strip conductor. A second end of the varactor diode is RF-grounded, thereby changing the capacitance of the varactor diode. The dielectric resonator may be coupled only with the first and second strip conductors, the microwave oscillator allows the apparent Q factor to be maintained at a high level and allows an improvement in the phase noise of the oscillation signal.

In addition, an optimal coupling can be achieved by shifting the dielectric resonator along the first and second strip conductors.

Preferably, the microwave oscillator further includes a third strip conductor having a free end. A second end of the varactor diode is connected to the strip conductor. The length of the third strip conductor is one quarter of the wavelength of an oscillation frequency. With this arrangement, the second end of the varactor diode can be securely RF-grounded.

Preferably, the transistor is a bipolar transistor. The bipolar transistor has a base as the input terminal, a collector as the output terminal, and an emitter that is RF-grounded. With this arrangement, a higher gain is achieved even at a transition frequency of about 20 GHz, thereby allowing oscillation at a frequency of 10 GHz or higher.

DESCRIPTION OF THE PREFERRED EMBODIMENT

Figure 1:
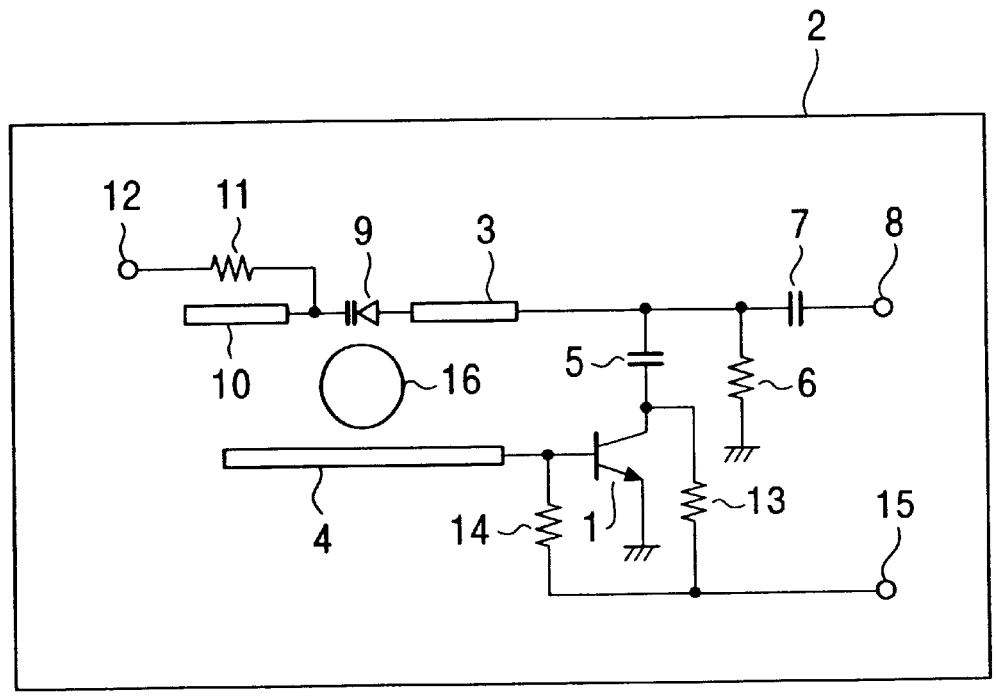
FIG. 1 is a circuit diagram illustrating the configuration of a microwave oscillator of the present invention.
Figure 2:
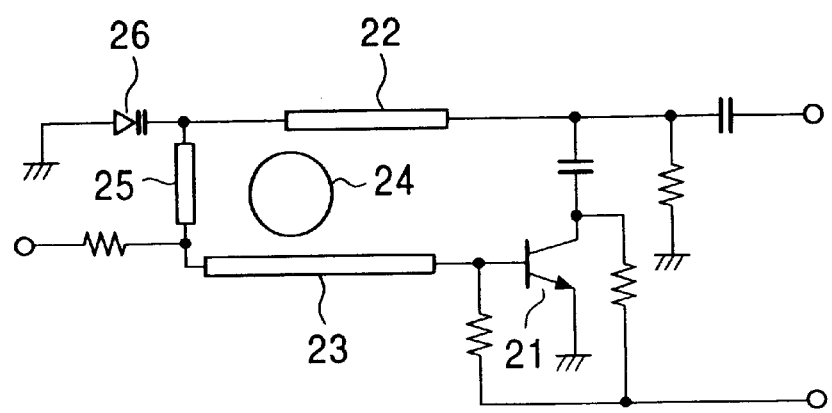
FIG 2 is a circuit diagram illustrating the configuration of a microwave oscillator of the related art.

The configuration of a microwave oscillator according to the present invention will now be described with reference to FIG. 1. One of the components of the microwave oscillator is an oscillator 1. In one embodiment, a bipolar transistor (hereinafter referred to as a "transistor") 1 is an active device used for oscillation. The transistor 1 is mounted on an insulating substrate 2. A first strip conductor 3 and a second strip conductor 4 are provided on the insulating substrate 2 so as to oppose each other. The first strip conductor 3 and the second strip conductor 4 are formed of conductive films attached to the insulating substrate 2. The conductive films may be formed from metal, such as copper, aluminum, tin, or gold, or any other conductive film(s) such as indium oxide (with or without metal such as tin or zinc) or conducting polymers. The first strip conductor 3 has a length of about one quarter of the wavelength of the oscillation frequency, while the second strip conductor 4 has a length of about one half of the wavelength of the oscillation frequency.

The first strip conductor 3 has a first end connected to a collector, which serves as an output terminal, of the transistor 1 through a DC-cutting capacitor 5. The first end of the first strip conductor 3 is also connected to ground through a resistor 6 and is connected to an output port 8 through a capacitor 7. A second end of the first strip conductor 3 is connected to the anode of a varactor diode 9.

The cathode of the varactor diode 9 is connected to a first end of a third strip conductor 10, a second end of the third strip conductor 10 is free, i.e. remains unconnected to an electronic component or voltage such as ground. Thus, the cathode of the varactor diode 9 is securely RF-grounded. The cathode of the varactor diode 9 is also connected to a control terminal 12 through a resistor 11. The third strip conductor 10 is also formed of a conductive film, fabricated from similar materials described above, attached to the insulating substrate 2. A control voltage is applied to the control terminal 12 to change the capacitance of the varactor diode 9.

On the other hand, the second strip conductor 4 has a first end connected to a base that serves as an input terminal of the transistor 1, and a second end of the second strip conductor 4 is free. The collector and base of the transistor 1 are connected to a power terminal 15 through feeding resistors 13 and 14, respectively. The emitter of the transistor 1 is RF-grounded.

A TE01-mode dielectric resonator 16 in the form of a cylinder is provided on the insulating member 2 between the first strip conductor 3 and the second strip conductor 4. The dielectric resonator 16 is positioned at substantially at the center of the second strip conductor 4. More particularly, the dielectric resonator 16 is disposed adjacent to the second strip conductor 4 and the center of the dielectric resonator 16 is aligned with substantially the center of the second strip conductor 4. As a result, the dielectric resonator 16 is coupled with the first strip conductor 3 and the second strip conductor 4, and a feedback loop is formed between the base and the collector of the transistor 1 through the first strip conductor 3, the dielectric resonator 16, and the second strip conductor 4.

In the configuration described above, when the control voltage is changed to alter the capacitance of the varactor diode 9, the voltage-current nodes (and antinodes) in the first strip conductor 3 are shifted relative to the dielectric resonator 16. This causes a change in the amount of coupling between the first strip conductor 3 and the dielectric resonator 16. Consequently, the coupling with the dielectric resonator 16 is greatly affected by the capacitive change of the varactor diode 9, thereby facilitating variation of the oscillation frequency and broadening the range of the variation.

Thus, in the present invention, the dielectric resonator 16 is coupled only with the first strip conductor 3 and the second strip conductor 4. This allows a high apparent Q factor to be maintained, thus improving the phase noise of the oscillation signal. According to the present invention, it is possible to provide a phase noise of 80 dB/kHz.

In order to satisfy the oscillation condition, the phase between the collector and the base must be shifted by $\pi/2$ (180°) using the feedback loop connecting the collector and the base of the transistor 1. In this case, an optimal coupling can be easily achieved by shifting the dielectric resonator 16 along the first strip conductor 3 and the second strip conductor 4.

While an FET (field effect transistor) may be used for the active device, a bipolar transistor having an FT (transition frequency) of about 20 GHz as a grounded emitter can also be used, which allows stable oscillation at a frequency of 10 GHz or higher.

In addition, while the varactor diode 9 is connected to the first end of the first strip conductor 3 in the configuration described above, connecting the variable diode 9 to the second strip conductor 4 can also provide the same result. In this case, the anode of the varactor diode 9 is connected to the second end of the second strip conductor 4, with the cathode being connected with the control terminal 12 through the resistor 11.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. A microwave oscillator comprising:
   an insulating substrate;
   a transistor provided on the insulating substrate;
   a first strip conductor provided on said insulating substrate, the first strip conductor having a first end connected to an output terminal of said transistor;
   a second strip conductor provided on said insulating substrate, the second strip conductor having a first end connected to an input terminal of said transistor;
   a TE01-mode dielectric resonator provided on the insulating substrate, the dielectric resonator to couple with said first strip conductor and said second strip conductor; and
   a varactor diode,
   wherein a first end of said varactor diode is connected with a second end of said first strip conductor, and a second end of said varactor diode is RF-grounded.

2. The microwave oscillator according to claim 1, further comprising a third strip conductor having a free end, wherein the second end of said varactor diode is connected with said third strip conductor, and a length of said third strip conductor is about one quarter of a wavelength of an oscillation frequency.

3. The microwave oscillator according to claim 1, wherein a length of the first strip conductor is about one quarter of a wavelength of an oscillation frequency and a length of the second strip conductor is about one half of a wavelength of an oscillation frequency.

4. The microwave oscillator according to claim 1, wherein said transistor is a bipolar transistor, the bipolar transistor having a base as the input terminal, a collector as the output terminal, and an emitter that is RF-grounded.

5. The microwave oscillator according to claim 1, wherein a center of the dielectric resonator is aligned with substantially a center of the second strip conductor.

6. The microwave oscillator according to claim 5, wherein the dielectric resonator is disposed between the first and second strip conductors.

7. The microwave oscillator according to claim 6, wherein the first and second strip conductors extend substantially in parallel along a first direction and the dielectric resonator is disposed between planes extending from the first and second strip conductors along the first direction.

8. The microwave oscillator according to claim 1, wherein the second end of the varactor diode is connected with a control voltage through a resistor.

9. The microwave oscillator according to claim 1, wherein the second end of the varactor diode is a cathode of the varactor diode.

10. The microwave oscillator according to claim 1, wherein a phase between the input terminal and the output terminal of the transistor is shifted by 180° through a feedback loop connecting the input terminal and the output terminal of the transistor.

11. The microwave oscillator according to claim 1, wherein the dielectric resonator is coupled only with the first strip conductor and the second strip conductor.

12. A microwave oscillator comprising:
an insulating substrate;
a transistor provided on the insulating substrate;
a first strip conductor provided on the insulating substrate, the first strip conductor having a first end connected to an output terminal of the transistor;
a second strip conductor provided on the insulating substrate, the second strip conductor having a first end connected to an input terminal of said transistor;
a TE01-mode dielectric resonator provided on the insulating substrate, the dielectric resonator coupling with the first strip conductor and the second strip conductor; and
a varactor diode,
wherein a first end of said varactor diode is connected with a second end of the second strip conductor, and a second end of the varactor diode is RF-grounded.

13. The microwave oscillator according to claim 12, further comprising a third strip conductor, wherein a second end of the first strip conductor is connected with a first end of the third strip conductor, a second end of the third strip conductor is free, and a length of the third strip conductor is about one quarter of a wavelength of an oscillation frequency.

14. The microwave oscillator according to claim 12, wherein a length of the first strip conductor is about one quarter of a wavelength of an oscillation frequency and a length of the second strip conductor is about one half of a wavelength of an oscillation frequency.

15. The microwave oscillator according to claim 12, wherein said transistor is a bipolar transistor, the bipolar transistor having a base as the input terminal, a collector as the output terminal, and an emitter that is RF-grounded.

16. The microwave oscillator according to claim 12, wherein a center of the dielectric resonator is aligned with substantially a center of the second strip conductor.

17. The microwave oscillator according to claim 16, wherein the dielectric resonator is disposed between the first and second strip conductors.

18. The microwave oscillator according to claim 17, wherein the first and second strip conductors extend substantially in parallel along a first direction and the dielectric resonator is disposed between planes extending from the first and second strip conductors along the first direction.

19. The microwave oscillator according to claim 12, wherein the second end of the varactor diode is connected with a control voltage through a resistor.

20. The microwave oscillator according to claim 12, wherein the second end of the varactor diode is a cathode of the varactor diode.

21. The microwave oscillator according to claim 12, wherein a phase between the input terminal and the output terminal of the transistor is shifted by 180° through a feedback loop connecting the input terminal and the output terminal of the transistor.

22. The microwave oscillator according to claim 12, wherein the dielectric resonator is coupled only with the first strip conductor and the second strip conductor.

23. A method of increasing phase noise in a microwave oscillator comprising:
coupling a TE01-mode dielectric resonator with a first strip conductor and a second strip conductor;
connecting a first end of a varactor diode with a first end of one of the first and second strip conductor and RF-grounding a second end of the varactor diode; and
forming feedback between an input terminal and an output terminal of a transistor using the first strip conductor, the dielectric resonator, and the second strip conductor.

24. The method of claim 23, further comprising altering a capacitance of the varactor diode by applying a voltage to the varactor diode thereby shifting voltage-current nodes in the first strip conductor relative to the dielectric resonator.

25. The method of claim 23, further comprising changing an amount of coupling between the first strip conductor and the dielectric resonator.

26. The method of claim 23, further comprising connecting a first end of a third strip conductor with a second end of the first strip conductor and leaving a second end of the third strip conductor free, a length of the third strip conductor being about one quarter of a wavelength of an oscillation frequency.

27. The method of claim 23, further comprising RF-grounding an emitter of the transistor.

28. The method of claim 23, further comprising aligning a center of the dielectric resonator with substantially a center of the second strip conductor.

29. The method of claim 28, further comprising placing the dielectric resonator between the first and second strip conductors.

30. The method of claim 29, further comprising placing the dielectric resonator between planes extending from the first and second strip conductors along a first direction, the first and second strip conductors extending substantially in parallel along the first direction.

31. The method of claim 23, further comprising applying a voltage to the second end of the varactor diode through a resistor.

32. The method of claim 23, further comprising applying a voltage to a cathode of the varactor diode through a resistor.

33. The method of claim 23, further comprising shifting a phase between the input terminal and the output terminal of the transistor by 180°.

34. The method of claim 23, further comprising coupling the TE01-mode dielectric resonator only with the first strip conductor and the second strip conductor.

35. A microwave oscillator comprising:
a TE01-mode dielectric resonator;
a plurality of coupled strip conductors coupled with the dielectric resonator;
at least one non-coupled strip conductor not coupled with the dielectric resonator, all of the strip conductors electrically connected with each other, the at least one non coupled strip conductor having an unconnected end; and
a circuit element connected to an end of one of the coupled strip conductors, a capacitance of the circuit element changeable by application of a voltage to the circuit element.

36. The microwave oscillator according to claim 35, wherein a length of one of the at least one non-coupled strip conductor is about one quarter of a wavelength of an oscillation frequency.

37. The microwave oscillator according to claim 35, wherein a length of a first coupled strip conductor of the plurality of coupled strip conductors is about one quarter of a wavelength of an oscillation frequency and a length of a second coupled strip conductor of the plurality of coupled strip conductors is about one half of a wavelength of an oscillation frequency.

38. The microwave oscillator according to claim 35, wherein a center of the dielectric resonator is aligned with substantially a center of one of the coupled strip conductors.

39. The microwave oscillator according to claim 37, wherein the circuit element is connected to the end of the first coupled strip conductor.

40. The microwave oscillator according to claim 37, wherein the circuit element is connected to the end of the second coupled strip conductor.

41. A microwave oscillator comprising:

a TE01-mode dielectric resonator;

a plurality of coupled strip conductors coupled with the dielectric resonator;

at least one non coupled strip conductor not coupled with the dielectric resonator, all of the strip conductors electrically connected with each other, and a length of one of the at least one non-coupled strip conductor is about a quarter of a wavelength of an oscillation frequency; and a circuit element connected to an end of one of the coupled strip conductors, a capacitance of the circuit element changeable by application of a voltage to the circuit element.

42. A microwave oscillator comprising:

a TE01-mode dielectric resonator;

a plurality of coupled strip conductors coupled with the dielectric resonator, a length of a first coupled strip conductor of the plurality of coupled strip conductors is about one quarter of a wavelength of an oscillation frequency and a length of a second coupled strip conductor of the plurality of coupled strip conductors is about one half of a wavelength of an oscillation frequency;

at least one non coupled strip conductor not coupled with the dielectric resonator, all of the strip conductors electrically connected with each other; and a circuit element connected to an end of one of the coupled strip conductors, a capacitance of the circuit element changeable by application of a voltage to the circuit element.

43. A microwave oscillator comprising:

a TE01-mode dielectric resonator;

a plurality of coupled strip conductors coupled with the dielectric resonator, and a center of the dielectric resonator is aligned with substantially a center of the one of the plurality of coupled strip conductors;

at least one non coupled strip conductor not coupled with the dielectric resonator, all of the strip conductors electrically connected with each other; and a circuit element connected to an end of one of the coupled strip conductors, a capacitance of the circuit element changeable by application of a voltage to the circuit element.

44. A microwave oscillator according to claim 42, wherein the circuit element is connected to the end of the first coupled strip conductor.

45. A microwave oscillator according to claim 42, wherein the circuit element is connected to the end of the second coupled strip conductor.

* * * * *

UNITED STATES PATENT AND TRADEMARK OFFICE
CERTIFICATE OF CORRECTION

PATENT NO. : 6,765,447 B2
DATED : July 20, 2004
INVENTOR(S) : Shigetaka Suzuki

It is certified that error appears in the above-identified patent and that said Letters Patent is hereby corrected as shown below:

<u>Title page,</u>
Item [56], References Cited, OTHER PUBLICATIONS, first referencce, delete "Sstems," and substitute -- Systems, -- in its place.

Signed and Sealed this

Fourth Day of January, 2005

JON W. DUDAS
*Director of the United States Patent and Trademark Office*